(12) United States Patent
Hikosaka et al.

(10) Patent No.: US 12,266,698 B2
(45) Date of Patent: Apr. 1, 2025

(54) NITRIDE SEMICONDUCTOR INCLUDING MULTI-PORTION NITRIDE REGION

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshiki Hikosaka, Kawasaki (JP); Hajime Nago, Yokohama (JP); Jumpei Tajima, Mitaka (JP); Shinya Nunoue, Ichikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 396 days.

(21) Appl. No.: 17/649,565

(22) Filed: Feb. 1, 2022

(65) Prior Publication Data

US 2023/0049717 A1    Feb. 16, 2023

(30) Foreign Application Priority Data

Aug. 16, 2021 (JP) ................................ 2021-132235

(51) Int. Cl.
*H01L 29/36* (2006.01)
*H01L 21/02* (2006.01)
(Continued)

(52) U.S. Cl.
CPC ........ *H01L 29/36* (2013.01); *H01L 21/02381* (2013.01); *H01L 21/02458* (2013.01);
(Continued)

(58) Field of Classification Search
CPC . H01L 29/36; H01L 29/2003; H01L 29/7786; H01L 29/207; H01L 29/4236; H01L 29/205
See application file for complete search history.

(56) References Cited

U.S. PATENT DOCUMENTS

| 9,117,743 B2* | 8/2015 | Komiyama ....... H01L 21/02579 |
| 10,186,588 B1* | 1/2019 | Kato ..................... H01L 29/778 |

(Continued)

FOREIGN PATENT DOCUMENTS

| JP | 2006-066834 A | 3/2006 |
| JP | 2011-103472 A | 5/2011 |

(Continued)

OTHER PUBLICATIONS

Japanese Notice of Reasons for Refusal issued Nov. 1, 2024 in Japanese Patent Application No. 2021-132235 with English Machine translation, 5 pgs.

*Primary Examiner* — Ida M Soward
(74) *Attorney, Agent, or Firm* — Oblon, McClelland, Maier & Neustadt, L.L.P.

(57) ABSTRACT

According to one embodiment, a nitride semiconductor includes a base body, and a nitride member. The nitride member includes a first nitride region including $Al_{x1}Ga_{1-x1}N$ ($0<x1\le1$), and a second nitride region including $Al_{x2}Ga_{1-x2}N$ ($0\le x2<1$, $x2<x1$). The first nitride region is between the base body and the second nitride region. The first nitride region includes a first portion and a second portion. The second portion is between the first portion and the second nitride region. An oxygen concentration in the first portion is higher than an oxygen concentration in the second portion. The oxygen concentration in the second portion is not more than $1\times10^{18}/cm^3$. A first thickness of the first portion in a first direction from the first to second nitride regions is thinner (Continued)

than a second thickness of the second portion in the first direction.

29 Claims, 7 Drawing Sheets

(51) Int. Cl.
  *H01L 29/20* (2006.01)
  *H01L 29/205* (2006.01)
  *H01L 29/778* (2006.01)
(52) U.S. Cl.
  CPC ...... *H01L 21/0254* (2013.01); *H01L 21/0262* (2013.01); *H01L 29/2003* (2013.01); *H01L 29/205* (2013.01); *H01L 29/7786* (2013.01)

(56) References Cited

U.S. PATENT DOCUMENTS

| | | | |
|---|---|---|---|
| 10,453,990 B2 | 10/2019 | Furusawa | |
| 2009/0200645 A1* | 8/2009 | Kokawa | H01L 29/045 257/E49.004 |
| 2010/0078678 A1* | 4/2010 | Kokawa | H01L 29/66462 257/E21.04 |
| 2010/0244096 A1* | 9/2010 | Sato | H01L 21/02505 257/190 |
| 2011/0272665 A1* | 11/2011 | Yamaguchi | H01L 21/0254 257/E29.074 |
| 2013/0043489 A1* | 2/2013 | Kotani | H01L 21/02381 257/77 |
| 2015/0263099 A1* | 9/2015 | Isobe | H01L 29/66522 257/76 |
| 2016/0056329 A1* | 2/2016 | Yoshida | H01L 33/007 438/47 |
| 2021/0184026 A1* | 6/2021 | Tajima | H01L 29/7789 |
| 2021/0226016 A1* | 7/2021 | Hikosaka | H01L 29/7787 |
| 2022/0045202 A1* | 2/2022 | Kajiwara | H01L 29/2003 |
| 2022/0190119 A1* | 6/2022 | Hikosaka | H01L 29/36 |
| 2022/0384631 A1* | 12/2022 | Smith | H01L 29/155 |
| 2024/0096969 A1* | 3/2024 | Hikosaka | H01L 29/7786 |

FOREIGN PATENT DOCUMENTS

| | | |
|---|---|---|
| JP | 2015-070085 A | 4/2015 |
| JP | 2018-163941 A | 10/2018 |
| JP | 2019-57588 A | 4/2019 |
| JP | 2021-027296 A | 2/2021 |
| WO | WO 2014/050250 A1 | 4/2014 |

* cited by examiner

NITRIDE SEMICONDUCTOR INCLUDING MULTI-PORTION NITRIDE REGION

CROSS-REFERENCE TO RELATED APPLICATIONS

This application is based upon and claims the benefit of priority from Japanese Patent Application No. 2021-132235, filed on Aug. 16, 2021; the entire contents of which are incorporated herein by reference.

FIELD

Embodiments described herein generally relate to a nitride semiconductor, a semiconductor device and a method for manufacturing a nitride semiconductor.

BACKGROUND

For example, a semiconductor device is manufactured using a wafer including a nitride semiconductor. It is desired to improve the quality of nitride semiconductors.

DETAILED DESCRIPTION

According to one embodiment, a nitride semiconductor includes a base body, and a nitride member. The nitride member includes a first nitride region including $Al_{x1}Ga_{1-x1}N$ ($0<x1\leq1$), and a second nitride region including $Al_{x2}Ga_{1-x2}N$ ($0\leq x2<1$, $x2<x1$). The first nitride region is between the base body and the second nitride region. The first nitride region includes a first portion and a second portion. The second portion is between the first portion and the second nitride region. An oxygen concentration in the first portion is higher than an oxygen concentration in the second portion. The oxygen concentration in the second portion is not more than $1\times10^{18}/cm^3$. A first thickness of the first portion in a first direction from the first nitride region to the second nitride region is thinner than a second thickness of the second portion in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
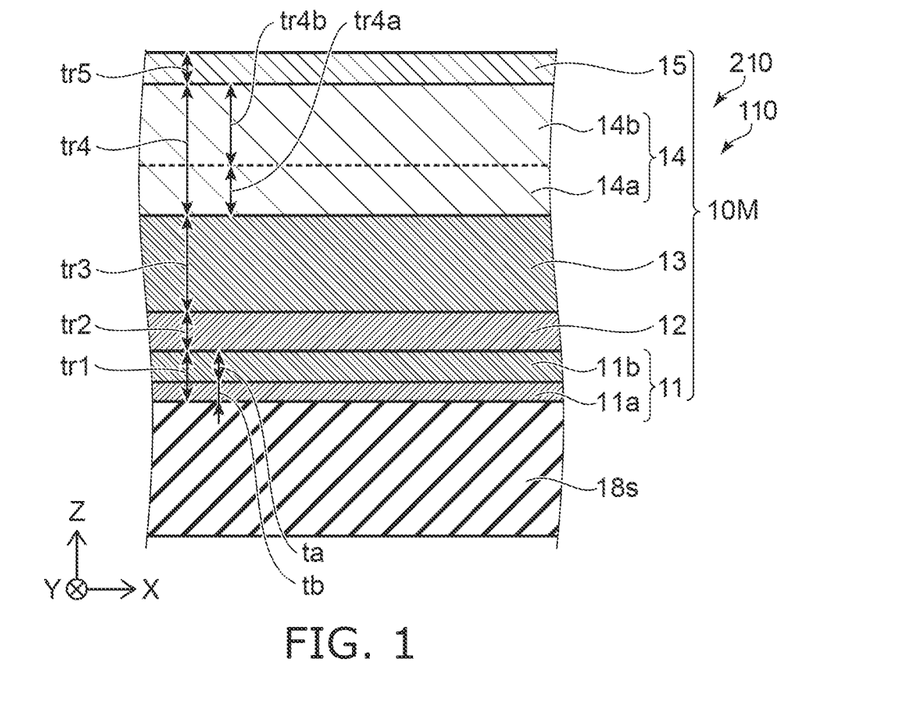
FIG. 1 is a schematic cross-sectional view illustrating a nitride semiconductor according to a first embodiment.

FIG. 1 is a schematic cross-sectional view illustrating a nitride semiconductor according to a first embodiment.

As shown in FIG. 1, a nitride semiconductor 110 according to the embodiment includes a base body 18s and a nitride member 10M. The wafer 210 includes a nitride semiconductor 110.

The base body 18s includes, for example, silicon. The base body 18s is, for example, a silicon substrate.

The nitride member 10M includes a first nitride region 11 and a second nitride region 12.

The nitride member 10M may include a third nitride region 13, a fourth nitride region 14, a fifth nitride region 15, and the like. The fourth nitride region 14 and the fifth nitride region 15 correspond to the functional layer. The third nitride region 13, the fourth nitride region 14, and the fifth nitride region 15 are provided as necessary and may be omitted. At least one of the third nitride region 13, the fourth nitride region 14, and the fifth nitride region 15 may be considered to be included in the second nitride region 12.

The first nitride region 11 includes $Al_{x1}Ga_{1-x1}N$ ($0<x1\leq1$). The composition ratio x1 of Al in the first nitride region 11 is, for example, not less than 0.35 and not more than 1. In one example, the first nitride region 11 includes AlN.

The second nitride region 12 includes $Al_{x2}Ga_{1-x2}N$ ($0\leq x2<1$, $x2<x1$). The second nitride region 12 includes AlGaN or GaN. The first nitride region 11 is between the base body 18s and the second nitride region 12.

A direction from the first nitride region 11 to the second nitride region 12 is defined as a first direction. The first direction is a Z-axis direction. One direction perpendicular to the Z-axis direction is defined as an X-axis direction. The direction perpendicular to the Z-axis direction and the X-axis direction is defined as a Y-axis direction.

The base body 18s, the first nitride region 11 and the second nitride region 12 are layered along the X-Y plane.

The first nitride region 11 includes a first portion 11a and a second portion 11b. The second portion 11b is between the first portion 11a and the second nitride region 12. For example, the first portion 11a may be in contact with the base body 18s. For example, the second portion 11b may be in contact with the second nitride region 12. The boundary between the first portion 11a and the second portion 11b may be unclear or clear.

An oxygen concentration in the first portion 11a is higher than an oxygen concentration in the second portion 11b. The oxygen concentration in the second portion 11b is not less than $1\times10^{18}/cm^3$.

As shown in FIG. 1, a first thickness ta of the first portion 11a in the first direction (the Z-axis direction) from the first nitride region 11 to the second nitride region 12 is thinner than a second thickness tb of the second portion 11b in the first direction. It has been found that such a configuration can suppress defects in the nitride member 10M. For example, the leakage current caused by the defect can be suppressed. According to the embodiment, a nitride semiconductor and a semiconductor device capable of improving quality can be provided.

For example, defects are considered to be formed due to dislocations in the nitride member 10M formed on the base body 18s. The defects are, for example, pits. It is considered that, for example, propagation of the dislocations can be suppressed by providing the first portion 11a having a high oxygen concentration. For example, when the first portion 11a includes AlN, oxygen oxidizes Al. The oxidized Al suppresses the propagation of dislocations, for example. The oxidized Al functions, for example, as a mask to stop dislocations. By providing the first portion 11a having a high oxygen concentration, defects are reduced.

It is considered that when the oxygen concentration is increased in entire region of the first nitride region 11, high-density oxygen inhibits the growth of AlN. As a result, for example, the flatness tends to be low. By providing the second portion 11b having a low oxygen concentration in addition to the first portion 11a having a high oxygen concentration, the inhibition of the growth of AlN can be suppressed. For example, it is easy to obtain high flatness.

The thickness tr1 (see FIG. 1) of the first nitride region 11 in the first direction (the Z-axis direction) from the first nitride region 11 to the second nitride region 12 may be a sum of the first thickness ta of the first portion 11a and the second thickness tb of the second portion 11b.

Figure 2:
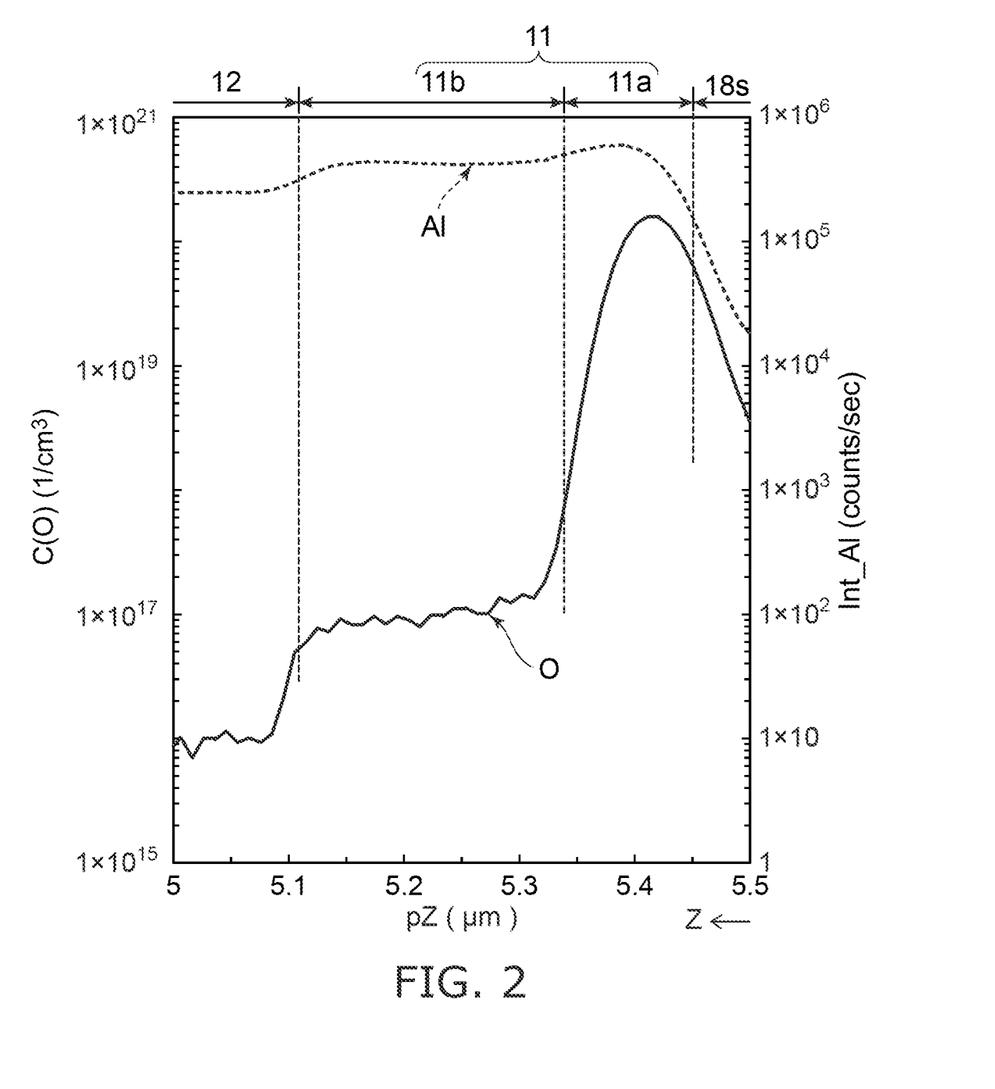
FIG. 2 is a graph illustrating the nitride semiconductor according to the first embodiment.

FIG. 2 is a graph illustrating the nitride semiconductor according to the first embodiment.

FIG. 2 illustrates results of SIMS (Secondary Ion Mass Spectrometry) analysis of the nitride semiconductor 110. In FIG. 2, the horizontal axis is a position pZ in the Z-axis direction. The vertical axis on the left side of FIG. 2 is the oxygen concentration C(O). The vertical axis on the right side of FIG. 2 is the secondary ion strength Int_Al of Al.

As shown in FIG. 2, the first nitride region 11 is provided between the base body 18s and the second nitride region 12. The first nitride region 11 includes the first portion 11a and the second portion 11b. The first portion 11a is between the base body 18s and the second portion 11b. The oxygen concentration C(O) in the first portion 11a is higher than the oxygen concentration C(O) in the second portion 11b.

As will be described later, such a plurality of portions having different oxygen concentrations C(O) can be formed by changing a temperature when forming the layer to be the first nitride region 11. In addition, the difference in oxygen concentration can also be formed by a growth rate at the time of forming the layer to be the first nitride region 11 or partial pressure of ammonia gas. For example, when the temperature is low, the oxygen concentration C(O) is high. For example, the faster the growth rate, the higher the oxygen concentration C(O). For example, when the partial pressure of ammonia gas is high, the oxygen concentration C(O) becomes high.

Hereinafter, an example of the experimental result regarding the defect density when the oxygen concentration C(O) in the second portion 11b is changed will be described.

Figure 3:
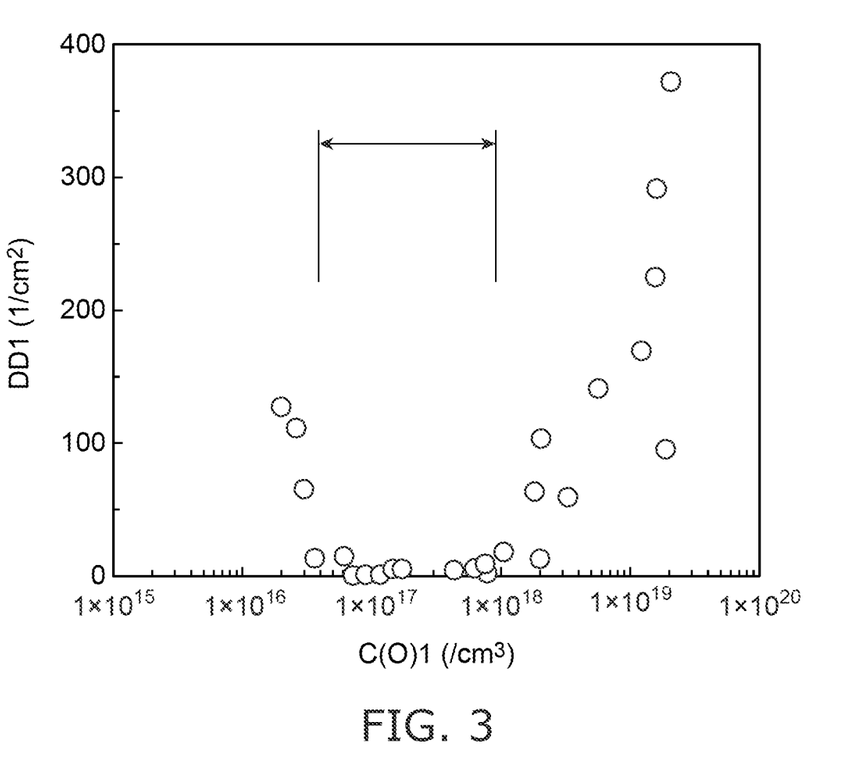
FIG. 3 is a graph illustrating the nitride semiconductor according to the first embodiment.

FIG. 3 is a graph illustrating the nitride semiconductor according to the first embodiment.

The horizontal axis of FIG. 3 is the oxygen concentration C(O)1 in the second portion 11b. The vertical axis of FIG. 3 is the defect density DD1 that causes leakage. The defect density DD1 can be detected, for example, by observing the surface of the nitride member 10M using an optical microscope. For example, in observation using an optical microscope, the number of pits per 1 cm$^2$ is calculated, and the defect density DD1 can be obtained from the calculation result.

As shown in FIG. 3, when the oxygen concentration C(O)1 in the second portion 11b is not less than $3 \times 10^{16}$/cm$^3$ and not more than $1 \times 10^{18}$/cm$^3$, the defect density DD1 is low. When the oxygen concentration C(O)1 is less than $3 \times 10^{16}$/cm$^3$, the defect density DD1 is high. When the oxygen concentration C(O)1 more than $1 \times 10^{18}$/cm$^3$, the defect density DD1 is high.

As shown in FIG. 3, the characteristics of the oxygen concentration C(O)1 and the defect density DD1 in the second portion 11b are critical. When the oxygen concentration C(O)1 is in the vicinity of about $3 \times 10^{13}$/cm$^3$, the defect density DD1 changes abruptly. When the oxygen concentration C(O) 1 is in the vicinity of about $1 \times 10^{18}$/cm$^3$, the defect density DD1 changes abruptly.

Hereinafter, an experimental example of the relationship between the magnitude relationship between the first thickness ta of the first portion 11a and the second thickness tb of the second portion 11b and the defect density will be described.

Figure 4A:
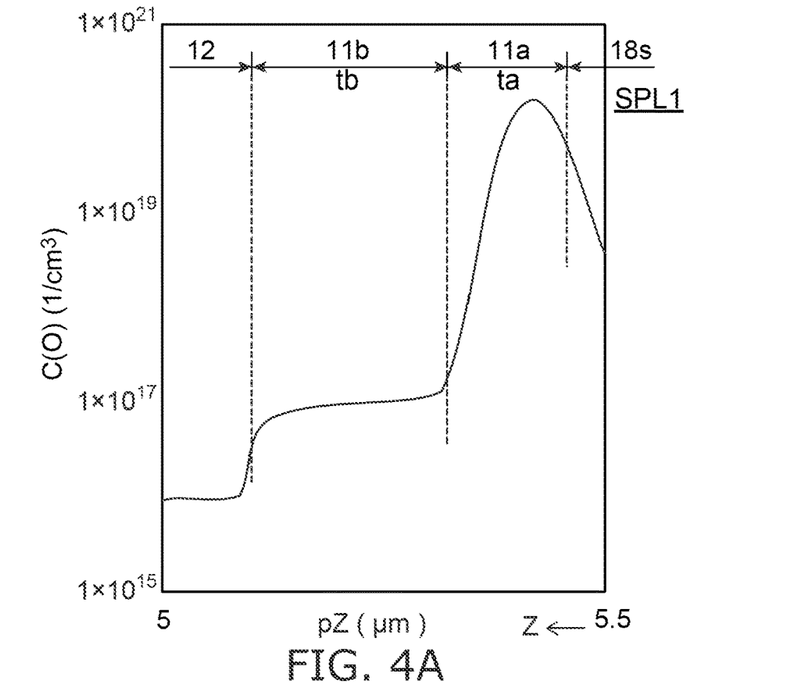
FIG. 4A and FIG. 4B are graphs illustrating the nitride semiconductor according to the first embodiment.
Figure 4B:
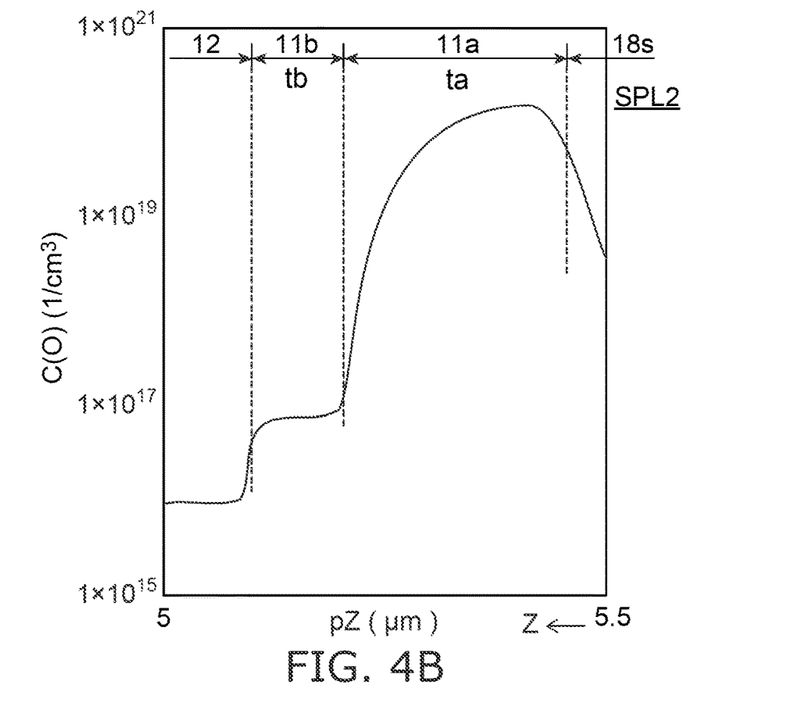

FIG. 4A and FIG. 4B are graphs illustrating the nitride semiconductor according to the first embodiment.

In these figures, the horizontal axis is the position pZ in the Z-axis direction. The vertical axis is the oxygen concentration C(O). FIG. 4A corresponds to a first sample SPL1. FIG. 4B corresponds to a second sample SPL2. In the first sample SPL1, the first thickness ta is thinner than the second portion 11b. In the second sample SPL2, the first thickness ta is thicker than the second portion 11b. As described below, it has been found that lower defect densities are obtained when the first thickness ta is thinner than the second portion 11b.

Figure 5:
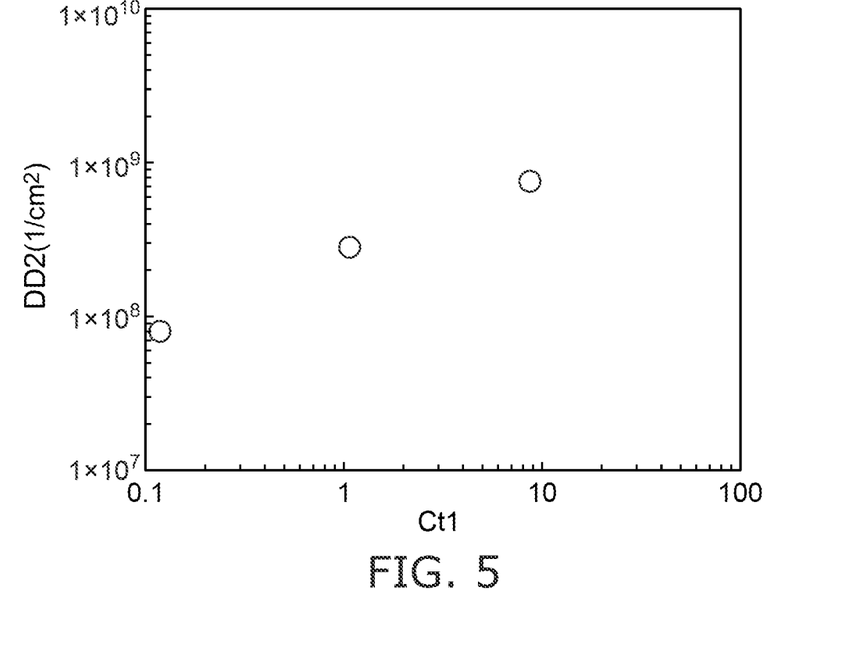
FIG. 5 is a graph illustrating the nitride semiconductor according to the first embodiment.

FIG. 5 is a graph illustrating the nitride semiconductor according to the first embodiment.

The horizontal axis in FIG. 5 is the thickness ratio Ct1. The thickness ratio Ct1 is a ratio of the first thickness ta of the first portion 11a to the second thickness tb of the second portion 11b. The vertical axis of FIG. 5 is a shape defect density DD2. Some of the shape defects are defects that cause leaks. In the experimental example of FIG. 5, the sum of the first thickness ta and the second thickness tb is 200 nm and is constant.

As shown in FIG. 5, when the thickness ratio Ct1 is low, the shape defect density DD2 is low. The thickness ratio Ct1 is preferably not more than 0.8, for example. The thickness ratio Ct1 may be, for example, not more than 0.5 or less. The thickness ratio Ct1 may be, for example, not more than 0.3 or less. The low thickness ratio Ct1 gives a low shape defect density DD2. The low shape defect density DD2 results in a low defect density DD1. The low shape defect density DD2 reduces the density of leak-causing defects.

As shown in FIG. 2, the oxygen concentration C(O) changes abruptly in the first portion 11a where the oxygen concentration C(O) is high. In the second portion 11b where the oxygen concentration C(O) is low, the oxygen concentration C(O) does not change abruptly. For example, in the first portion 11a, it is considered that the inhibition of the growth of AlN can be effectively suppressed by the sharp decrease in the oxygen concentration C(O). Thereby, for example, high flatness can be effectively obtained.

For example, the change rate of the oxygen concentration C(O) in the first portion 11a with respect to the first direction (the Z-axis direction) is higher than the change rate of the oxygen concentration C(O) in the second portion 11b with respect to the first direction. With such a profile, defects can be suppressed and high flatness can be obtained. For example, a nitride semiconductor and a semiconductor device capable of improving quality can be provided.

The oxygen concentration C(O) in the first portion 11a is preferably, for example, more than $1 \times 10^{18}/cm^3$ and not more than $3.6 \times 10^{20}/cm^3$. If the oxygen concentration C(O) in the first portion 11a is excessively high, it is considered that the growth of AlN is inhibited. As a result, for example, the flatness tends to be low.

The oxygen concentration C(O) in the first portion 11a is preferably not less than $2.5 \times 10^{19}/cm^3$, for example. Thereby, the propagation of dislocations can be effectively suppressed.

As shown in FIG. 2, the oxygen concentration C(O) in the second nitride region 12 is lower than the oxygen concentration C(O) in the second portion 11b. As a result, high flatness can be obtained in the second nitride region 12. It is easy to obtain the second nitride region 12 having high quality. The oxygen concentration C(O) in the second nitride region 12 is preferably not more than $1 \times 10^{17}/cm^3$, for example. It is easy to obtain the second nitride region 12 having high quality.

In the embodiment, the first thickness ta is preferably not less than 5 nm and not more than 150 nm. When the first thickness ta is not less than 5 nm, for example, a low defect density can be easily obtained. When the first thickness ta is not more than 150 nm, a homogeneous first portion 11a can be easily obtained.

In the embodiment, the second thickness tb is preferably not less than 50 nm and not more than 300 nm. As described above, the second thickness tb is thicker than the first thickness ta. When the second thickness tb is not more than 50 nm, for example, a homogeneous second portion 11b can be easily obtained. When the second thickness tb is not more than 300 nm, for example, a low defect density can be easily obtained.

The first nitride region 11 includes, for example, AlN. The second nitride region 12 includes, for example, AlGaN. The base body 18s includes, for example, silicon.

As shown in FIG. 1, the nitride member 10M may include a third nitride region 13. The third nitride region 13 includes, for example, $Al_{x3}Ga_{1-x3}N$ ($0 \leq x3 \leq 1$). The third nitride region 13 includes, for example, AlGaN or GaN. As will be described later, the third nitride region 13 may have, for example, a stacked structure. A thickness of the third nitride region 13 (a third nitride region thickness tr3: see FIG. 1) is, for example, not less than 1000 nm and not more than 8000 nm.

As shown in FIG. 1, as already described, the nitride member 10M may include the fourth nitride region 14 and the fifth nitride region 15. The fourth nitride region 14 includes $Al_{x4}Ga_{1-x4}N$ ($0 \leq x4 < 1$). The composition ratio x4 of Al in the fourth nitride region 14 is, for example, not less than 0 and not more than 0.5. The fourth nitride region 14 includes, for example, GaN. A composition ratio x4 of Al in the fourth nitride region 14 is lower than the composition ratio of Al in the third nitride region 13. A thickness of the fourth nitride region 14 (the fourth nitride region thickness tr4 (see FIG. 1)) is, for example, not less than 50 nm and not more than 5000 nm.

As shown in FIG. 1, the fourth nitride region 14 may include a first film region 14a and a second film region 14b. The first film region 14a is between the third nitride region 13 and the second film region 14b. The first film region 14a includes carbon. The second film region 14b does not carbon. Alternatively, a carbon concentration in the second film region 14b is lower than a carbon concentration in the first film region 14a. By providing the first film region 14a including carbon, for example, a low dislocation density can be easily obtained. Due to the second film region 14b having a low carbon concentration, for example, high electron mobility can be easily obtained. A thickness of the first film region 14a (a first film region thickness tr4a (see FIG. 1)) is, for example, not less than 100 nm and not more than 3000 nm. A thickness of the second film region 14b (a second film region thickness tr4b (see FIG. 1)) is, for example, not less than 50 nm and not more than 2000 nm.

The fifth nitride region 15 includes $Al_{x5}Ga_{1-x5}N$ ($0 < x5 \leq 1$, $x4 < x5$). The composition ratio x5 of Al in the fifth nitride region 15 is, for example, not less than 0.05 and not more than 0.35. The fifth nitride region 15 is, for example, AlGaN. A thickness of the fifth nitride region 15 (a fifth nitride region thickness tr5 (see FIG. 1)) is, for example, not less than 15 nm and not more than 50 nm. The second nitride region 12 is between the first nitride region 11 and the fifth nitride region 15. The third nitride region 13 is between the second nitride region 12 and the fifth nitride region 15. The fourth nitride region 14 is between the third nitride region 13 and the fifth nitride region 15. The fourth nitride region 14 is between the second nitride region 12 and the fifth nitride region 15.

For example, a carrier region is formed in a portion of the fourth nitride region 14 facing the fifth nitride region 15. The carrier region is, for example, a two-dimensional electron gas. In a semiconductor device based on a nitride semiconductor 110, the carrier region is used for the operation of the semiconductor device.

The nitride member 10M is formed by, for example, a MOCVD (metal organic chemical vapor deposition) method or the like, using a raw material gas including a group III element (Al or Ga) and a raw material gas including a group V element (N).

The semiconductor device according to the embodiment includes, for example, the base body 18s and the nitride member 10M. The nitride member 10M includes a first nitride region 11 including $Al_{x1}Ga_{1-x1}N$ ($0 < x1 \leq 1$). The first nitride region 11 includes the first portion 11a and the second portion 11b. The first portion 11a is between the base body 18s and the second portion 11b. The oxygen concentration in the first portion 11a is higher than the oxygen concentration in the second portion 11b. The oxygen concentration in the second portion 11b is not less than $1 \times 10^{18}/cm^3$. The first thickness ta of the first portion 11a in the first direction from the base body 18s to the first nitride region 11 is thinner than the second thickness tb of the second portion 11b in the first direction. Leakage current caused by defects can be suppressed. Nitride semiconductors and semiconductor devices that can improve quality can be provided.

Figure 6:
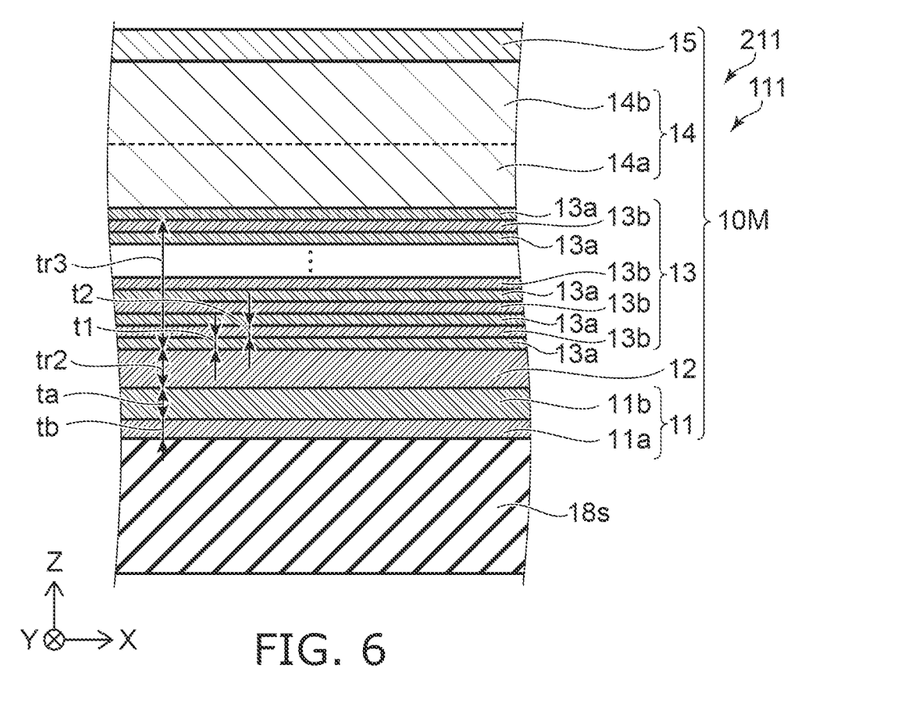
FIG. 6 is a schematic cross-sectional view illustrating a nitride semiconductor according to the first embodiment.

FIG. 6 is a schematic cross-sectional view illustrating a nitride semiconductor according to the first embodiment.

As shown in FIG. 6, in the nitride semiconductor 111 and the wafer 211 according to the embodiment, the third nitride region 13 has a stacked structure.

For example, the third nitride region 13 includes a plurality of first regions 13a and a plurality of second regions 13b. In the first direction (the Z-axis direction) from the first nitride region 11 to the second nitride region 12, one of the plurality of first regions 13a is between one of the plurality of second regions 13b and another one of the plurality of second regions 13b. The one of the plurality of second regions 13b is between the one of the plurality of first regions 13a and another one of the plurality of first regions 13a. For example, the first region 13a and the second region 13b are alternately provided along the Z-axis direction.

The first region 13a includes $Al_{y1}Ga_{1-y1}N$ (0<y1≤1). The second region 13b includes $Al_{y2}Ga_{1-y2}N$ (0≤y2<y1).

The Al composition ratio (a composition ratio y1) in the first region 13a is, for example, not less than 0.75 and not more than 1. In one example, the first region 13a is AlN.

The Al composition ratio (a composition ratio y2) in the second region 13b is, for example, not less than 0.06 and not more than 0.3. In one example, the second region 13b is $Al_{0.13}Ga_{0.87}N$.

In one example, the composition ratio y1 not less than the composition ratio x1. In one example, the composition ratio y2 is higher than the composition ratio x2.

For example, one of the plurality of first regions 13a may be in contact with the second nitride region 12. For example, one of the plurality of second regions 13b may be in contact with the second nitride region 12. For example, one of the plurality of first regions 13a may be in contact with the fourth nitride region 14. For example, one of the plurality of second regions 13b may be in contact with the fourth nitride region 14. The plurality of first regions 13a and the plurality of second regions 13b may form, for example, a superlattice structure. The absolute value of the difference between the number of the plurality of first regions 13a and the number of the plurality of second regions 13b may be 0 or 1. The number of the plurality of first regions 13a is, for example, not less than 10 and not more than 200. One of the plurality of first regions 13a may be regarded as the second nitride region 12.

Each of the plurality of first regions 13a has a first region thickness t1 along the first direction (the Z-axis direction). For example, the first region thickness t1 is thinner than the second nitride region thickness tr2 along the first direction of the second nitride region 12. Each of the plurality of second regions 13b has a second region thickness t2 along the first direction. For example, the second region thickness t2 is thinner than the second nitride region thickness tr2. For example, the first region thickness t1 is thinner than the second region thickness t2.

For example, the thickness t1 of the first region along the first direction of each of the plurality of first regions 13a is thinner than the thickness tr3 of the first nitride region along the first direction of the first nitride region 11. The second region thickness t2 along the first direction of each of the plurality of second regions 13b is thinner than the first nitride region thickness tr1.

The thickness t1 of the first region is, for example, not less than 3 nm and not more than 10 nm. In one example, the first region thickness t1 is 5 nm. The second region thickness t2 is, for example, not less than 15 nm and not more than 40 nm. In one example, the second region thickness t2 is 25 nm.

In the third nitride region 13 having such a structure, for example, at the interface between the first region 13a and the second region 13b, dislocations tend to bend. It is easy to obtain a lower dislocation density. By providing a plurality of regions having different Al composition ratios, for example, high breakdown voltage can be easily obtained.

Hereinafter, an example of a method for manufacturing the nitride semiconductor 111 (the wafer 211) will be described.

The base body 18s is treated by organic cleaning and acid cleaning. The base body 18s is introduced into an MOCVD apparatus. The surface of the base body 18s is heat treated at 1000° C. in a hydrogen atmosphere. By the heat treatment, for example, the oxide film on the surface of the base body 18s is removed.

After that, the first nitride region 11 is formed. For example, an AlN layer serves as the first portion 11a is formed at 780° C. using trimethylaluminum (TMAl) and ammonia ($NH_3$). The first thickness ta of the first portion 11a is, for example, 80 nm (for example, not less than 5 nm and not more than 150 nm). The growth temperature at the time of forming the first portion 11a is, for example, not less than 550° C. and not more than 800° C.

After that, the temperature of the base body 18s is set to 1020° C., and an AlN layer served as the second portion 11b is formed using TMAl and $NH_3$. The second thickness tb of the second portion 11b is, for example, 250 nm (for example, not less than 90 nm and mt more than 300 nm). The growth temperature when forming the second portion 11b is, for example, not less than 1000° C. and mot more than 1100° C.

The oxygen concentration C(O) in the first portion 11a and the second portion 11b can be changed by, for example, the temperature (the temperature of the base body 18s) or the partial pressure of ammonia. By lowering the temperature, the oxygen concentration C(O) increases. By increasing the partial pressure of ammonia, the oxygen concentration C(O) increases. For example, the partial pressure of ammonia when forming the first portion 11a is 73 Pa, and the partial pressure of ammonia when forming the second portion 11b is 6 Pa. For example, the partial pressure of ammonia when forming the second portion 11b is not more than 1/10 of the partial pressure of ammonia when forming the first portion 11a.

For example, the second portion 11b substantially does not include carbon. Alternatively, the concentration of carbon in the second portion 11b is lower than, for example, the concentration of carbon in the first portion 11a. For example, the ratio of the carbon concentration in the second portion 11b to the carbon concentration in the first portion 11a is not more than 0.05. By the first portion 11a including carbon, a low dislocation density can be easily obtained, for example, in the nitride member 10M. For example, in the first portion 11a including carbon, the direction of dislocation is easily bent. This reduces dislocations propagating to the second portion 11b. For example, the ratio of the carbon concentration in the second portion 11b to the carbon concentration in the first portion 11a may be not less than 0.0001.

After that, the second nitride region 12 is formed. For example, an AlGaN layer served as at least part of the second nitride region 12 is formed at 960° C. using TMAl, trimethylgallium (TMGa) and ammonia. The AlGaN layer is, for example, a carbon-doped $Al_{0.12}Ga_{0.88}N$ layer. The thickness of the second nitride region 12 (the second nitride region thickness tr2) is, for example, 250 nm (for example, not less than 50 nm and not more than 2000 nm). The carbon concentration in the second nitride region 12 is, for example, $4.0 \times 10^{18}/cm^3$. For example, the concentration of carbon in the second nitride region 12 is higher than the concentration of carbon in the first nitride region 11. By the second nitride region 12 including carbon, it is easy to obtain a low dislocation density in, for example, the nitride member 10M. For example, in the second nitride region 12 including carbon, the direction of dislocation is easily bent. This reduces dislocations that extend above the second nitride region 12. The oxygen concentration in the second nitride region 12 is, for example, $7.9 \times 10^{15}/cm^3$. For example, the oxygen concentration in the second nitride region 12 is lower than the oxygen concentration in the first nitride region 11. As a result, high flatness can be obtained in the second nitride region 12. It is easy to obtain the second nitride region 12 with high quality.

After that, the third nitride region 13 is formed. For example, the third nitride region 13 includes a plurality of first regions 13a and a plurality of second regions 13b. For example, an AlN layer served as the first region 13a is formed in an atmosphere including nitrogen and hydrogen using TMAl and ammonia. The temperature at which the first region 13a is formed is, for example, 940° C. The thickness of the first region 13a (the first region thickness t1) is, for example, 5 nm (for example, not less than 2 nm and not more than 15 nm).

On the first region 13a, an $Al_{0.13}Ga_{0.87}N$ layer served as the second region 13b is formed using TMAl, TMGa and ammonia. The temperature at which the second region 13b is formed is, for example, 940° C. The thickness of the second region 13b (the second region thickness t2) is, for example, 25 nm (for example, not less than 15 nm and not more than 40 nm). The forming the first region 13a and the forming the second region 13b are repeated 125 times in total. One first region 13a is further formed on the last second region 13b. Thereby, the third nitride region 13 is formed.

The carbon concentration in the third nitride region 13 is, for example, $1.5 \times 10^{19}/cm^3$ (for example, not less than $5 \times 10^{18}/cm^3$ and not more than $9 \times 10^{19}/cm^3$). The oxygen concentration in the third nitride region 13 is, for example, $3.9 \times 10^{16}/cm^3$ (for example, $5 \times 10^{16}/cm^3$ or more and $1 \times 10^{17}/cm^3$ or less). For example, the concentration of carbon in the third nitride region 13 is higher than the concentration of carbon in the second nitride region 12. The oxygen concentration in the third nitride region 13 is higher than the oxygen concentration in the second nitride region 12.

Then, the temperature of the base body 18s is set to, for example, 940° C., and the first film region 14a is formed in a hydrogen atmosphere by using TMGa and ammonia. The first film region 14a is, for example, a GaN layer. The first film region 14a includes carbon. The thickness of the first film region 14a is, for example, 1000 nm (for example, not less than 100 nm and not more than 3000 nm). The carbon concentration in the first film region 14a is, for example, $3 \times 10^{19}/cm^3$ (for example, not less than $5 \times 10^{18}/cm^3$ and not more than $9 \times 10^{19}/cm^3$).

After that, the temperature of the base body 18s is set to, for example, 1040° C., and the second film region 14b is formed using TMGa and ammonia. The second film region 14b is, for example, an undoped GaN layer. The thickness of the second film region 14b is, for example, 500 nm (for example, not less than 50 nm and not more than 2000 nm).

After that, the temperature of the base body 18s is set to, for example, 1020° C., the fifth nitride region 15 is formed using TMGa, TMAl and ammonia. The fifth nitride region 15 is, for example, an undoped $Al_{0.2}Ga_{0.8}N$ layer. The thickness of the fifth nitride region 15 is, for example, 30 nm (for example, not less than 15 nm and not more than 50 nm).

The first film region 14a, the second film region 14b, and the fifth nitride region 15 become a part of the functional layer.

Second Embodiment

The second embodiment relates to a semiconductor device.

Figure 7:
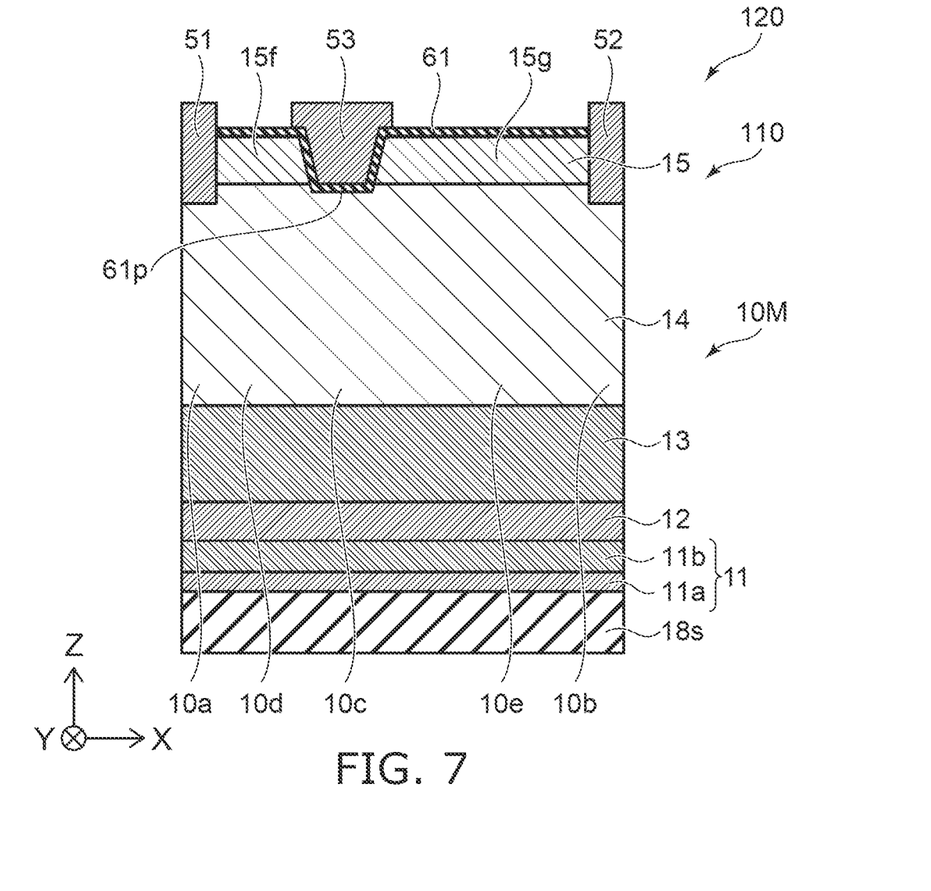
FIG. 7 is a schematic cross-sectional view illustrating a semiconductor device according to a second embodiment.

FIG. 7 is a schematic cross-sectional view illustrating the semiconductor device according to the second embodiment.

As shown in FIG. 7, a semiconductor device 120 according to the embodiment includes the nitride semiconductor (in this example, a nitride semiconductor 110) according to the first embodiment, a first electrode 51, a second electrode 52, and a third electrode 53, and an insulating member 61.

A direction from the first electrode 51 to the second electrode 52 is along a second direction crossing the first direction (the Z-axis direction). The second direction is, for example, the X-axis direction. A position of the third electrode 53 in the second direction is between a position of the first electrode 51 in the second direction and a position of the second electrode 52 in the second direction.

The nitride member 10M includes the first to fifth nitride regions 11 to 15. The fourth nitride region 14 includes a first partial region 10a, a second partial region 10b, a third partial region 10c, a fourth partial region 10d, and a fifth partial region 10e. A direction from the first partial region 10a to the first electrode 51 is along the first direction (the Z-axis direction). A direction from the second partial region 10b to the second electrode 52 is along the first direction. A third partial region 10c is between the first partial region 10a and the second partial region 10b in the second direction (the X-axis direction). The direction from the third partial region 10c to the third electrode 53 is along the first direction. The fourth partial region 10d is between the first partial region 10a and the third partial region 10c in the second direction. The fifth partial region 10e is between the third partial region 10c and the second partial region 10b in the second direction.

The fifth nitride region 15 includes the sixth partial region 15f and the seventh partial region 15g. A direction from the fourth partial region 10d to the sixth partial region 15f is along the first direction (the Z-axis direction). A direction from the fifth partial region 10e to the seventh partial region 15g is along the first direction.

The insulating member 61 is located between the nitride member 10M and the third electrode 53. For example, the insulating member 61 includes a first insulating region 61p. The first insulating region 61p is provided between the third partial region 10c and the third electrode 53 in the first direction (the Z-axis direction).

The semiconductor device 120 may include the nitride semiconductor 111. In the semiconductor device 120, a current flowing between the first electrode 51 and the second electrode 52 can be controlled by a potential of the third electrode 53. The potential of the third electrode 53 is, for example, a potential based on a potential of the first electrode 51. The first electrode 51 functions as, for example, a source electrode. The second electrode 52 functions as, for example, a drain electrode. The third electrode 53 functions as, for example, a gate electrode. In one example, the semiconductor device 120 is a HEMT (High Electron Mobility Transistor). According to the embodiment, it is possible to provide a semiconductor device whose characteristics can be improved.

In the semiconductor device 120, at least a part of the third electrode 53 is between the sixth partial region 15f and the seventh partial region 15g in the second direction (for example, the X-axis direction). At least a part of the third electrode 53 may be between the fourth partial region 10d and the fifth partial region 10e in the second direction (for example, the X-axis direction). The semiconductor device 120 is, for example, a normally-off type.

Figure 8:
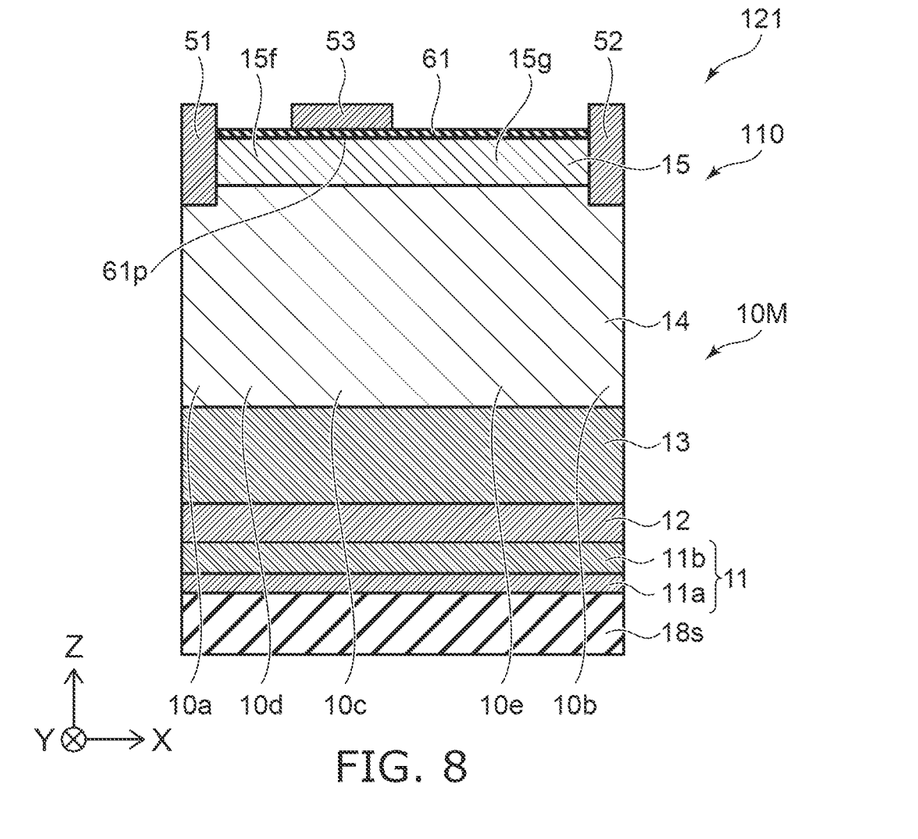
FIG. 8 is a schematic cross-sectional view illustrating a semiconductor device according to the second embodiment.

FIG. 8 is a schematic cross-sectional view illustrating a semiconductor device according to the second embodiment.

As shown in FIG. 8, a semiconductor device 121 according to the embodiment includes the nitride semiconductor (in this example, a nitride semiconductor 110) according to the first embodiment, the first electrode 51, the second electrode 52, the third electrodes 53, and the insulating member 61. In the semiconductor device 121, the third electrode 53 does not overlap the sixth partial region 15f and the seventh partial region 15g in the second direction (for example, the X-axis direction). The third electrode 53 does not overlap the fourth partial region 10d and the fifth partial region 10e in the second direction (for example, the X-axis direction). The semiconductor device 121 is, for example, a normally-on type.

Third Embodiment

The third embodiment relates to a method for manufacturing a nitride semiconductor. The method for manufacturing a nitride semiconductor according to the third embodiment may be applied to a method for manufacturing the wafer or the method for manufacturing the semiconductor device.

Figure 9:
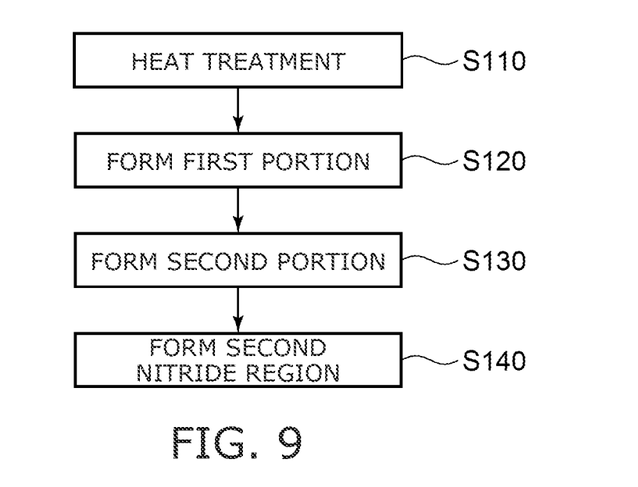
FIG. 9 is a flowchart illustrating a method for manufacturing the nitride semiconductor according to the third embodiment.

FIG. 9 is a flowchart illustrating a method for manufacturing the nitride semiconductor according to the third embodiment.

As shown in FIG. 9, in the method for producing a nitride semiconductor according to the embodiment, the first portion 11a of the first nitride region 11 including $Al_{x1}Ga_{1-x1}N$ ($0<x1\le 1$) is formed at the first temperature (step S120). After the forming the first portion 11a, the second portion 11b of the first nitride region 11 is formed at a second temperature higher than the first temperature (step S130). After the forming the second portion 11b, the second nitride region 12 including $Al_{x2}Ga_{1-x2}N$ ($0\le x2<1$, $x2<x1$) is formed (step S140). As shown in FIG. 9, the base body 18s may be heat-treated before step S120 (step S110).

By the above temperature, the oxygen concentration C(O) in the first portion 11a becomes higher than the oxygen concentration C(O) in the second portion 11b.

The oxygen concentration C(O) in the second portion 11b is not more than $1\times 10^{18}/cm^3$. The first thickness ta of the first portion 11a is thinner than the second thickness tb of the second portion 11b.

By such a manufacturing method, it is possible to provide a nitride semiconductor, a semiconductor device, and a method for manufacturing a nitride semiconductor whose quality can be improved.

In the embodiment, the oxygen concentration C(O) in the second portion 11b is preferably not less than $3\times 10^{16}/cm^3$. The oxygen concentration C(O) in the second portion 11b is preferably not less than $1\times 10^{18}/cm^3$ and not more than $3.6\times 10^{20}/cm^3$.

The above first temperature is, for example, not less than 550° C. and not more than 800° C. The second temperature is, for example, not less than 1000° C. The second temperature is, for example, not more than 1100° C.

For example, the third temperature in the formation of the second nitride region 12 is higher than the above first temperature. A low oxygen concentration C(O) is obtained in the second nitride region 12. The oxygen concentration C(O) in the second nitride region 12 is lower than the oxygen concentration C(O) in the second portion 11b.

In the embodiment, information on the structure of the nitride region and the like can be obtained by, for example, electron microscope observation. Information on the composition and element concentration in the nitride region can be obtained by, for example, EDX (Energy Dispersive X-ray Spectroscopy) or SIMS (Secondary Ion Mass Spectrometry). Information on the composition in the nitride region may be obtained, for example, by X-ray reciprocal lattice space mapping.

According to the embodiment, it is possible to provide a nitride semiconductor, a semiconductor device, and a method for manufacturing the nitride semiconductor, which can improve the quality.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductor such as nitride members, nitride region, base body, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors, semiconductor devices, and methods for manufacturing nitride semiconductors practicable by an appropriate design modification by one skilled in the art based on the nitride semiconductors, the semiconductor devices, and the methods for manufacturing nitride semiconductors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A nitride semiconductor, comprising:
a base body; and
a nitride member,
the nitride member including,
a first nitride region including $Al_{x1}Ga_{1-x1}N$ ($0<x1\le 1$),
a second nitride region including $Al_{x2}Ga_{1-x2}N$ ($0\le x2<1$, $x2<x1$), and
a third nitride region including $Al_{x3}Ga_{1-x3}N$ ($0\le x3\le 1$),
the second nitride region being between the first nitride region and the third nitride region,
the first nitride region being between the base body and the second nitride region,
the first nitride region including a first portion and a second portion,
the second portion being between the first portion and the second nitride region,
an oxygen concentration in the first portion being higher than an oxygen concentration in the second portion,
the oxygen concentration in the second portion being not more than $1\times 10^{18}/cm^3$, a first thickness of the first portion in a first direction from the first nitride region to the second nitride region being thinner than a second thickness of the second portion in the first direction.

2. The semiconductor according to claim 1, wherein the first thickness is not less than 0.8 times the second thickness.

3. The semiconductor according to claim 1, wherein
the first thickness is not less than 5 nm and not more than 150 nm, and
the second thickness is not less than 50 nm and not more than 300 nm.

4. The semiconductor according to claim 1, wherein the oxygen concentration in the second portion is not less than $3 \times 10^{16}/cm^3$.

5. The semiconductor according to claim 1, wherein the oxygen concentration in the first portion is more than $1 \times 10^{18}/cm^3$ and is not more than $3.6 \times 10^{20}/cm^3$.

6. The semiconductor according to claim 5, wherein the oxygen concentration in the first portion is not less than $2.5 \times 10^{19}/cm^3$.

7. The semiconductor according to claim 1, wherein an oxygen concentration in the second nitride region is lower than the oxygen concentration in the second portion.

8. The semiconductor according to claim 7, wherein the oxygen concentration in the second nitride region is not more than $1 \times 10^{17}/cm^3$.

9. The semiconductor according to claim 1, wherein the first nitride region includes AlN.

10. The semiconductor according to claim 1, wherein the base body includes silicon.

11. The semiconductor according to claim 1, wherein
the third nitride region includes a plurality of first regions and a plurality of second regions,
one of the first regions is between one of the second regions and an other one of the second regions in a first direction from the first nitride region to the second nitride region,
the one of the second regions is between the one of the first regions and an other one of the first regions in the first direction,
the first regions include $Al_{y1}Ga_{1-y1}N$ ($0<y1\le1$), and
the second regions include $Al_{y2}Ga_{1-y2}N$ ($0\le y2<y1$).

12. The semiconductor according to claim 1, wherein an oxygen concentration in the third nitride region is higher than an oxygen concentration in the second nitride region.

13. A nitride semiconductor, comprising:
a base body; and
a nitride member,
the nitride member including,
a first nitride region including $Al_{x1}Ga_{1-x1}N$ ($0<x1\le1$),
a second nitride region including $Al_{x2}Ga_{1-x2}N$ ($0\le x2<1$, $x2<x1$),
a third nitride region including $Al_{x3}Ga_{1-x2}N$ ($0\le x3\le1$),
the second nitride region being between the first nitride region and the third nitride region,
the first nitride region being between the base body and the second nitride region,
the first nitride region including a first portion and a second portion,
the second portion being between the first portion and the second nitride region,
an oxygen concentration in the first portion being higher than an oxygen concentration in the second portion,
the oxygen concentration in the second portion being not more than $1 \times 10^{18}/cm^3$,
a change rate of the oxygen concentration in the first portion in a first direction from the first nitride region to the second nitride region being higher than a change rate of the oxygen concentration in the second portion in the first direction.

14. The semiconductor according to claim 13, wherein
the third nitride region includes a plurality of first regions and a plurality of second regions,
one of the first regions is between one of the second regions and an other one of the second regions in a first direction from the first nitride region to the second nitride region,
the one of the second regions is between the one of the first regions and an other one of the first regions in the first direction,
the first regions include $Al_{y1}Ga_{1-y1}N$ ($0<y1\le1$), and
the second regions include $Al_{y2}Ga_{1-y2}N$ ($0\le y2<y1$).

15. The semiconductor according to claim 13, wherein an oxygen concentration in the third nitride region is higher than an oxygen concentration in the second nitride region.

16. A nitride semiconductor, comprising:
a base body; and
a nitride member,
the nitride member including,
a first nitride region including $Al_{x1}Ga_{1-x1}N$ ($0<x1\le1$),
a second nitride region including $Al_{x2}Ga_{1-x2}N$ ($0\le x2<1$, $x2<x1$),
a fourth nitride region including $Al_{x4}Ga_{1-x4}N$ ($0\le x4<1$), and
a fifth nitride region including $Al_{x5}Ga_{1-x5}N$ ($0<x5\le1$, $x4<x5$),
the fourth nitride region being between the second nitride region and the fifth nitride region,
the first nitride region being between the base body and the second nitride region,
the first nitride region including a first portion and a second portion,
the second portion being between the first portion and the second nitride region,
an oxygen concentration in the first portion being higher than an oxygen concentration in the second portion,
the oxygen concentration in the second portion being not more than $1 \times 10^{18}/cm^3$,
a first thickness of the first portion in a first direction from the first nitride region to the second nitride region being thinner than a second thickness of the second portion in the first direction.

17. A semiconductor device, comprising
the nitride semiconductor according to claim 16;
a first electrode;
a second electrode;
a third electrode; and
an insulating member,
a direction from the first electrode to the second electrode being along a second direction crossing a first direction from the first nitride region to the second nitride region,
a position of the third electrode in the second direction being between a position of the first electrode in the second direction and a position of the second electrode in the second direction,
the fourth nitride region including a first partial region, a second partial region, a third partial region, a fourth partial region, and a fifth partial region,
a direction from the first partial region to the first electrode being along the first direction, a direction from the second partial region to the second electrode being along the first direction, the third partial region being located between the first partial region and the second partial region in the second direction, a direction from the third partial region to the third electrode being along the first direction, the fourth partial region being between the first partial region and the third partial region in the second direction, the fifth partial region being between the third partial region and the second partial region in the second direction, the fifth nitride region including a sixth partial region and a seventh partial region, a direction from the fourth partial region to the sixth partial region being along the first direction, a direction from the fifth partial region to the seventh partial region being along the first direction, and the insulating member being between the nitride member and the third electrode.

18. The semiconductor device according to claim 17, wherein the nitride member further includes a third nitride region including $Al_{x3}Ga_{1-x3}N$ (0≤x3 ≤1), the second nitride region is between the first nitride region and the third nitride region, and an oxygen concentration in the third nitride region is higher than an oxygen concentration in the second nitride region.

19. The semiconductor according to claim 16, wherein the nitride member further includes a third nitride region including $Al_{x3}Ga_{1-x3}N$ (0≤x3 ≤1), and the second nitride region is between the first nitride region and the third nitride region.

20. The semiconductor according to claim 19, wherein the third nitride region includes a plurality of first regions and a plurality of second regions, one of the first regions is between one of the second regions and an other one of the second regions in a first direction from the first nitride region to the second nitride region, the one of the second regions is between the one of the first regions and an other one of the first regions in the first direction, the first regions include $Al_{y1}Ga_{1-y1}N$ (0<y≤1), and the second regions include $Al_{y2}Ga_{1-y2}N$ (0≤y2<y1).

21. The semiconductor according to claim 19, wherein an oxygen concentration in the third nitride region is higher than an oxygen concentration in the second nitride region.

22. A nitride semiconductor, comprising:

a base body; and a nitride member, the nitride member including, a first nitride region including $Al_{x1}Ga_{1-x1}N$ (0<x1≤1), a second nitride region including $Al_{x2}Ga_{1-x2}N$ (0≤x2<1, x2<x1), a fourth nitride region including $Al_{x4}Ga_{1-x4}N$ (0≤x4<1), and a fifth nitride region including $Al_{x5}Ga_{1-x5}N$ (0<x5≤1, x4<x5), the fourth nitride region is between the second nitride region and the fifth nitride region, the first nitride region being between the base body and the second nitride region, the first nitride region including a first portion and a second portion, the second portion being between the first portion and the second nitride region, an oxygen concentration in the first portion being higher than an oxygen concentration in the second portion, the oxygen concentration in the second portion being not more than $1\times10^{18}/cm^3$ a change rate of the oxygen concentration in the first portion in a first direction from the first nitride region to the second nitride region being higher than a change rate of the oxygen concentration in the second portion in the first direction.

23. The semiconductor according to claim 22, wherein the nitride member further includes a third nitride region including $Al_{x3}Ga_{1-x3}N$ (0≤x3 ≤1), and the second nitride region is between the first nitride region and the third nitride region.

24. The semiconductor according to claim 23, wherein the third nitride region includes a plurality of first regions and a plurality of second regions, one of the first regions is between one of the second regions and an other one of the second regions in a first direction from the first nitride region to the second nitride region, the one of the second regions is between the one of the first regions and an other one of the first regions in the first direction, the first regions include $Al_{y1}Ga_{1-y1}N$ (0<y1≤1), and the second regions include $Al_{y2}Ga_{1-y2}N$ (0≤y2<y1).

25. The semiconductor according to claim 20, wherein an oxygen concentration in the third nitride region is higher than an oxygen concentration in the second nitride region.

26. A semiconductor device, comprising the nitride semiconductor according to claim 22;

a first electrode;

a second electrode;

a third electrode; and an insulating member, a direction from the first electrode to the second electrode being along a second direction crossing a first direction from the first nitride region to the second nitride region, a position of the third electrode in the second direction being between a position of the first electrode in the second direction and a position of the second electrode in the second direction, the fourth nitride region including a first partial region, a second partial region, a third partial region, a fourth partial region, and a fifth partial region, a direction from the first partial region to the first electrode being along the first direction, a direction from the second partial region to the second electrode being along the first direction, the third partial region being located between the first partial region and the second partial region in the second direction, a direction from the third partial region to the third electrode being along the first direction, the fourth partial region being between the first partial region and the third partial region in the second direction, the fifth partial region being between the third partial region and the second partial region in the second direction, the fifth nitride region including a sixth partial region and a seventh partial region, a direction from the fourth partial region to the sixth partial region being along the first direction, a direction from the fifth partial region to the seventh partial region being along the first direction, and the insulating member being between the nitride member and the third electrode.

27. The semiconductor device according to claim 26, wherein the nitride member further includes a third nitride region including $Al_{x3}Ga_{1-x3}N$ ($0 \leq x3 \leq 1$), and the second nitride region is between the first nitride region and the third nitride region.

28. The semiconductor device according to claim 27, wherein the third nitride region includes a plurality of first regions and a plurality of second regions, one of the first regions is between one of the second regions and an other one of the second regions in a first direction from the first nitride region to the second nitride region, the one of the second regions is between the one of the first regions and an other one of the first regions in the first direction, the first regions include $Al_{y1}Ga_{1-y1}N$ ($0 < y1 \leq 1$), and the second regions include $Al_{y2}Ga_{1-y2}N$ ($0 \leq y2 < y1$).

29. The semiconductor device according to claim 27, wherein an oxygen concentration in the third nitride region is higher than an oxygen concentration in the second nitride region.

* * * * *